United States Patent
Itoh et al.

(10) Patent No.: US 7,053,660 B2
(45) Date of Patent: May 30, 2006

(54) OUTPUT BUFFER CIRCUIT AND CONTROL METHOD THEREFOR

(75) Inventors: Kunihiro Itoh, Kasugai (JP); Osamu Uno, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/121,130

(22) Filed: May 4, 2005

(65) Prior Publication Data

US 2005/0189964 A1 Sep. 1, 2005

Related U.S. Application Data

(62) Division of application No. 09/735,555, filed on Dec. 14, 2000, now Pat. No. 6,924,669.

(30) Foreign Application Priority Data

Mar. 30, 2000 (JP) ............... 2000-093760
Apr. 4, 2000 (JP) ............... 2000-102455

(51) Int. Cl.
*H03K 19/094* (2006.01)
*H03K 19/0175* (2006.01)
(52) U.S. Cl. ............... 326/87; 326/83; 326/27
(58) Field of Classification Search ............ 326/87, 326/83, 26, 27; 327/170, 108
See application file for complete search history.

(56) References Cited

U.S. PATENT DOCUMENTS

| | | | |
|---|---|---|---|
| 4,612,466 A * | 9/1986 | Stewart | ............... 327/437 |
| 4,779,013 A | 10/1988 | Tanaka | |
| 5,166,555 A | 11/1992 | Kano | |
| 5,319,260 A | 6/1994 | Wanlass | |
| 5,719,509 A * | 2/1998 | Chan | ............... 327/112 |
| 5,877,638 A | 3/1999 | Lin | |
| 6,281,706 B1 | 8/2001 | Wert et al. | |

FOREIGN PATENT DOCUMENTS

| | | |
|---|---|---|
| JP | 63-240207 | 10/1988 |
| JP | 2-241114 A | 9/1990 |
| JP | 3-242020 | 10/1991 |
| JP | 5-206828 | 8/1993 |
| JP | 5-327443 | 12/1993 |
| JP | 6-61762 | 3/1994 |
| JP | 8-111636 | 4/1996 |
| JP | 8-288825 | 11/1996 |
| JP | 9-162719 | 6/1997 |
| JP | 9-186577 | 7/1997 |
| JP | 10-93415 | 4/1998 |
| JP | 11-17517 | 1/1999 |
| JP | 11-251897 | 9/1999 |
| TW | 11-250244 | 6/1995 |

* cited by examiner

*Primary Examiner*—Daniel Chang
(74) *Attorney, Agent, or Firm*—Arent Fox PLLC

(57) ABSTRACT

An output buffer includes a first drive circuit that receives an input signal having a sharp waveform and generates an output signal that has a gentle waveform. A second drive circuit is connected to the first drive circuit at an output terminal and has a lower impedance than the first drive circuit. A delay circuit is also connected to the output terminal and generates a delayed output signal. A first control circuit is connected between the delay circuit and the second drive circuit and receives the input signal and the delayed output signal and generates a first control signal used to drive the second drive circuit.

7 Claims, 12 Drawing Sheets

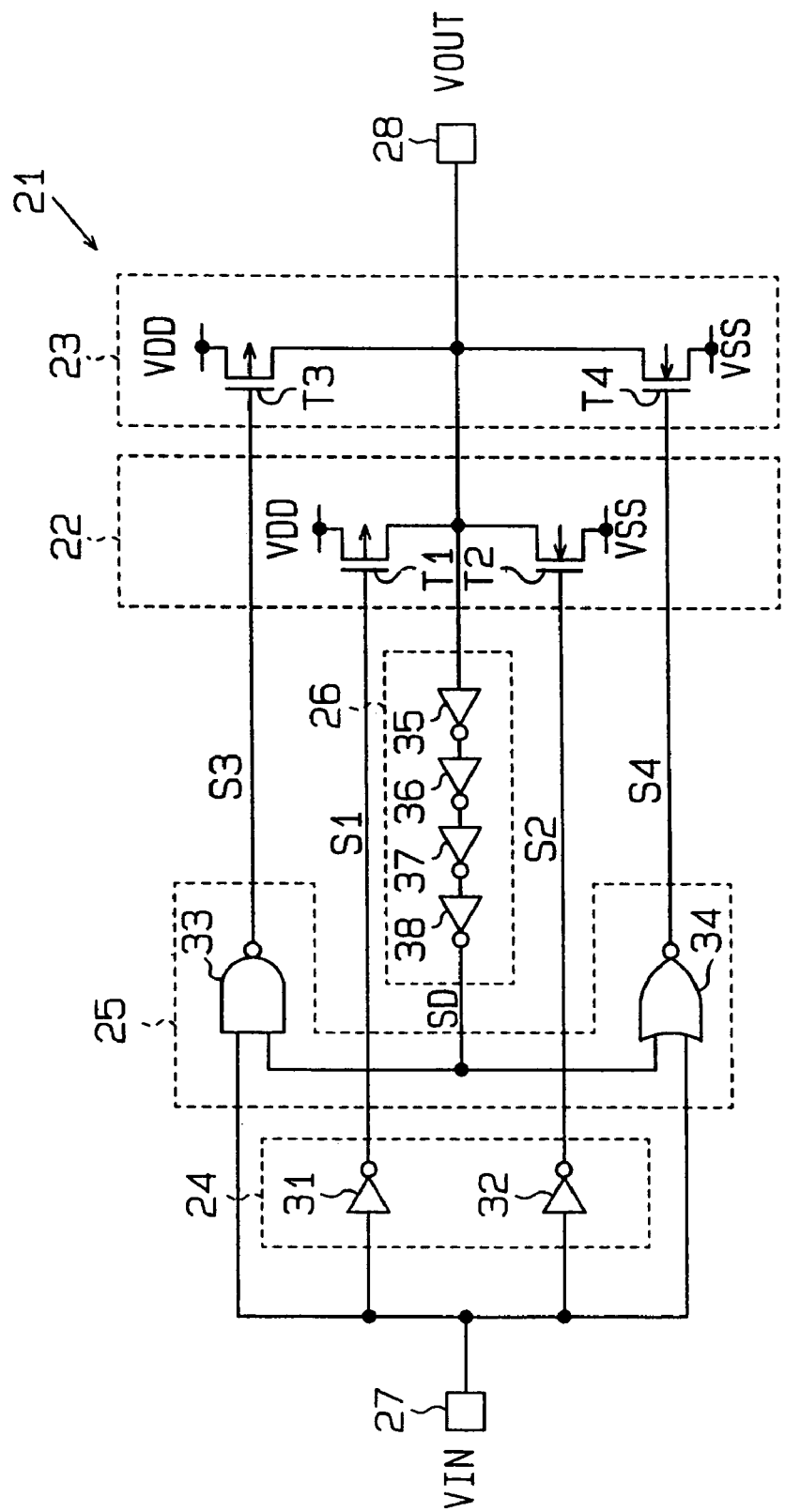

OUTPUT BUFFER CIRCUIT AND CONTROL METHOD THEREFOR

CROSS-REFERENCE TO RELATED APPLICATION

This is a Division of application Ser. No. 09/735,555 filed Dec. 14, 2000, is now a U.S. Pat. No. 6,924,669. The disclosure of the palor application is hereby incorporated by reference herein in its entirety.

BACKGROUND OF THE INVENTION

The present invention relates to an output buffer circuit, and, more particularly, to an output buffer circuit that outputs an output signal having gentle rising and falling edges and a slew-rate control type output buffer circuit.

For example, an interface, such as USB (Universal Serial Bus), which is used to connect a computer to a keyboard and achieves slow data transfer, is equipped with an output buffer circuit which has long signal rising and falling times. The use of a signal which has long rising and falling times makes it unnecessary to provide a bus cable with a shield for preventing undesirable radiation.

FIG. 1 is a schematic circuit diagram of a first prior art output buffer circuit 11.

The output buffer circuit 11 has a drive circuit 12 and first and second control circuits 13 and 14. The drive circuit 12 has a P channel (PMOS) transistor TP1 and an N channel (NMOS) transistor TN1 which are connected in series between a high-potential power supply VDD and a low-potential power supply VSS. A node between the PMOS and NMOS transistors TP1 and TN1 is connected to an output terminal 15 of the output buffer circuit 11.

The first control circuit 13 has a PMOS transistor TP2 and two NMOS transistors TN2 and TN3, which are connected in series between the high-potential power supply VDD and low-potential power supply VSS. A node between the PMOS transistor TP2 and the adjacent NMOS transistor TN2 is connected to the gate of the PMOS transistor TP1. An external input signal VIN is applied to the gates of the individual transistors TP2, TN2 and TN3. In response to the external input signal VIN, the transistors TP2, TN2 and TN3 supply a control signal VP to the gate of the output transistor TP1.

The second control circuit 14 has two PMOS transistors TP3 and TP4 and an NMOS transistor TN4, which are connected in series between the high-potential power supply VDD and low-potential power supply VSS. A node between the PMOS transistor TP4 and the adjacent NMOS transistor TN4 is connected to the gate of the NMOS transistor TN1. The external input signal VIN is applied to the gates of the individual transistors TP3, TP4 and TN4. In response to the external input signal VIN, the transistors TP3, TP4 and TN4 supply the control signal VN to the gate of the output transistor TN1.

Each of the PMOS and NMOS transistors TP1 and TN1 has a relatively large transistor size (gate width). That is, each of the PMOS and NMOS transistors TP1 and TN1 has a low impedance with respect to the output terminal 15. The NMOS transistors TN2 and TN3 of the first control circuit 13 control the amount of current flowing into the low-potential power supply VSS, so that the control signal VP having a gentle falling edge is supplied to the PMOS transistor TP1. As a result, an external output signal VOUT which has a gentle rising edge is output from the output terminal 15. The PMOS transistors TP3 and TP4 of the second control circuit 14 control the amount of current flowing out of the high-potential power supply VDD, so that a control signal VN having a gentle rising edge is supplied to the NMOS transistor TN1. As a result, the external output signal VOUT which has a gentle falling edge is output from the output terminal 15.

In other words, the waveform of the output signal VOUT has gentle transition by controlling the waveform transition times of the control signals VP and VN that are respectively applied to the gates of the output transistors TP1 and TN1 by the first and second control circuits 13 and 14.

The minimum values and maximum values of the rising time and falling time of the output signal VOUT are specified by specifications. However, the waveforms of the control signals VP and VN are greatly affected by variations in the sizes of the individual transistors TP2–TP4 and TN2–TN4 or variations in the wiring capacitances between the first and second control circuits 13 and 14 and the output transistors TP1 and TN2, which are factors of the manufacturing process, a variation in supply voltage or a temperature change. That is, variations in the rising and falling times of the external output signal VOUT are increased, so that the rising and falling times exceed the specified ranges.

FIG. 2 is a schematic circuit diagram of a second prior art slew-rate control type output buffer circuit 211. The output buffer circuit 211 adjusts the inclination (slew rate) of the input waveform to the gate of an output driving transistor to reduce the consumed current at the time the output signal varies. The output buffer circuit 211 has output driving transistors (simply called "output transistors") T1 and T2, slew-rate control circuits 212 and 213 which perform the ON/OFF control of the respective output transistors T1 and T2 in response to the external input signal VIN, and a delay circuit 214.

The first output transistor T1, which is a PMOS transistor, and the second output transistor T2, which is an NMOS transistor, are connected in series between a high-potential power supply VDD and low-potential power supply VSS, with a node between the transistors T1 and T2 being connected to an output terminal 215 of the output buffer circuit 211. Specifically, the first output transistor T1 has a source connected to the high-potential power supply VDD and a drain connected to an output terminal 215, with a control signal VP from the first control circuit 212 being applied to the gate of the transistor T1. The second output transistor T2 has a source connected to the low-potential power supply VSS and a drain connected to the output terminal 215, with a control signal VN from the second control circuit 213 being applied to the gate of the transistor T2.

The first control circuit 212 has a PMOS transistor T11 and NMOS transistors T12 and T13, connected in series between the high-potential power supply VDD and low-potential power supply VSS, and an NMOS transistor T14 connected in parallel to the NMOS transistor T13. The PMOS transistor T11 has a source connected to the high-potential power supply VDD and a drain connected to the drain of the NMOS transistor T12, with an external input signal VIN being applied to the gates of both transistors T11 and T12. The source of the NMOS transistor T12 is connected to the drain of the NMOS transistor T13 whose source is connected to the low-potential power supply VSS. The NMOS transistor T14 has a relatively large ON resistance and its gate is connected to the high-potential power supply VDD. Therefore, the NMOS transistor T14 is normally ON and serves as a resistor element.

The second control circuit 213 has PMOS transistors T21 and T22 and an NMOS transistor T23, connected in series between the high-potential power supply VDD and low-potential power supply VSS, and a PMOS transistor T24 connected in parallel to the PMOS transistor T21. The PMOS transistor T21 has a source connected to the high-potential power supply VDD and a drain connected to the source of the PMOS transistor T22, with the external input signal VIN being applied to the gates of both transistors T21 and T22. The drain of the PMOS transistor T22 is connected to the drain of the NMOS transistor T23 whose source is connected to the low-potential power supply VSS. The PMOS transistor T24 has a relatively large ON resistance and its gate is connected to the low-potential power supply VSS. Therefore, the PMOS transistor T24 is normally ON and serves as a resistor element.

The delay circuit 214 is comprised of an inverter circuit which has an input terminal to which the external input signal VIN is applied and an output terminal connected to the gates of the NMOS transistor T13 and PMOS transistor T21.

The output buffer circuit 211 operates as follows.

(1) When the external input signal VIN changes its level from the L level (the level of the low-potential power supply VSS) to the H level (the level of the high-potential power supply VDD), the PMOS transistor T22 is turned off immediately, and the NMOS transistor T23 is turned on, causing the control signal VN to rapidly fall to the L level from the H level. Therefore, the output transistor T2 is turned off immediately.

In response to the H-level external input signal VIN, the first (PMOS) transistor T11 is turned off immediately, and the NMOS transistor T12 is turned on. However, the H-level external input signal VIN which has been delayed by the delay circuit 214 is applied to the gate of the NMOS transistor T13. That is, the H-level inverted external input signal VIN before the change of the external input signal VIN is applied to the gate of the NMOS transistor T13 for a predetermined time. Therefore, the NMOS transistor T13 is enabled for a predetermined delay time so that the control signal VP rapidly falls as indicated by *1 in FIG. 3. When the level of the delay signal from the delay circuit 214 changes to the L level from the H level after the predetermined delay time passes, the NMOS transistor T13 is turned off so that the control signal VP gently falls due to the large ON resistance of the NMOS transistor T14. Therefore, the time needed for the first output transistor T1 to be turned on completely is longer than the time for the second output transistor T2 to be turned off, thus generating the external output signal VOUT that gently changes to the H level from the L level.

(2) When the external input signal VIN changes its level from the H level to the L level, the NMOS transistor T12 is turned off immediately, and the PMOS transistor T11 is turned on, causing the control signal VP to rapidly rise to the H level from the L level. Therefore, the first output transistor T1 is turned off immediately.

In response to the L-level external input signal VIN, the NMOS transistor T23 is turned off immediately, and the PMOS transistor T22 is turned on. However, the L-level external input signal VIN which has been delayed by the delay circuit 214 is applied to the gate of the PMOS transistor T21. That is, the L-level inverted external input signal VIN before the change of the external input signal VIN is applied to the gate of the PMOS transistor T21 for a predetermined time. Therefore, the PMOS transistor T21 is enabled for a predetermined delay time so that the control signal VP rapidly rises as indicated by *2 in FIG. 3. When the level of the delay signal from the delay circuit 214 changes to the H level from the L level after the predetermined delay time passes, the PMOS transistor T21 is turned off so that the control signal VN gently rises due to the large ON resistance of the PMOS transistor T24. Thus, the time needed for the second output transistor T2 to be turned on completely becomes longer than the time for the first output transistor T1 to be turned off, thus generating the external output signal VOUT that gently changes to the L level from the H level.

FIG. 3 shows the waveforms of the control signals VP and VN, the external output signal VOUT and a switching current I which flows through the output transistors T1 and T2. When the external output signal VOUT changes its level to the H level from the L level, as shown in FIG. 3, the control signal VP gently falls and the control signal VN drastically falls. As a result, the output transistors T1 and T2 are not turned on at the same time. At the time the level of the external output signal VOUT changes to the L level from the H level, likewise, the output transistors T1 and T2 are not turned on simultaneously. This reduces the current I that flows through the output transistors T1 and T2 at the time of switching, thus decreasing the consumed current of the output buffer circuit 211.

As the NMOS transistor T13 and the PMOS transistor T21 are turned on for the delay time of the delay circuit 214 at the time of switching, the control signals VP and VN drastically change as indicated by *1 and *2. Because the delay time of the delay circuit 214 is set to the time for the control signals VP and VN to reach the threshold voltages of the output transistors T1 and T2, the rising and falling responses of the external output signal VOUT become faster, thus decreasing the propagation delay time of the output buffer circuit 211. Since the slew rate of the external output signal VOUT is lower than that of the output signal of an ordinary CMOS inverter, the output buffer circuit 211 is suited for slow (low-frequency) data transfer.

In the case where the output buffer circuit 211 should be used for high-frequency data transfer, however, the control signals VP and VN cannot change in response to a high frequency, so that the external output signal VOUT cannot fully swing. When the external input signal VIN as shown in FIG. 4(a) is supplied to the output buffer circuit 211, for example, the control signals VP and VN cannot reach the H level and L level because of a fast change in external input signal VIN as shown in FIG. 4(b). As a result, the external output signal VOUT does not reach the H level (the level of the high-potential power supply VDD) as shown in FIG. 4(c). That is, the external output signal VOUT that has an H-level pulse width W2 narrower than an H-level pulse width W1 of the external input signal VIN is generated, which may cause an error in data transfer. The pulse width W2 also becomes narrower by variations in the process, temperature and supply voltage (PTV variations), which may result in malfunction.

To use the output buffer circuit 211 at a slower speed than the present operational speed, on the other hand, it is necessary to keep the voltages of the control signals VP and VN at an intermediate potential near the threshold voltages of the output transistors T1 and T2 for a long time. This however also raises the aforementioned problems that concern the full swing of the external output signal VOUT and the pulse width in the previous case.

SUMMARY OF THE INVENTION

Accordingly, it is a first object of the present invention to provide an output buffer circuit capable of outputting a signal which has less variation in transition time.

It is a second object of present invention to provide a slew-rate control type output buffer circuit which can cope with a high or low operational frequency.

In a first aspect of the present invention, a method of controlling an output buffer circuit is provided. The output buffer circuit includes a first drive circuit for receiving an input signal having a sharp waveform and generating an output signal that has a gentle waveform and is output from an output terminal of the output buffer circuit, and a second drive circuit connected to the output terminal and having a lower output impedance than the first drive circuit. The method includes the steps of changing the output signal in accordance with a change in the input signal using the first drive circuit and driving the second drive circuit after the output signal is changed by a predetermined amount.

In a second aspect of the present invention, a method of controlling an output buffer circuit is provided. The output buffer circuit includes first and second drive circuits. The first drive circuit includes a first output transistor connected between a first power supply and an output terminal of the output buffer circuit and a second output transistor connected between a second power supply and the output terminal. The first and second output transistors generate an output signal having gentle waveform in response to an input signal having a sharp waveform. The second drive circuit includes a third output transistor connected between the first power supply and the output terminal and a fourth output transistor connected between the second power supply and the output terminal. The third and fourth output transistors have lower impedances than the first and second output transistors. First, the output signal is generated in accordance with the input signal using the first drive circuit. Then, a delay signal is generated by delaying the output signal and a control signal for controlling the third and fourth output transistors is generated in accordance with the delay signal and the input signal to drive the second drive circuit in accordance with the control signal.

In a third aspect of the present invention, an output buffer circuit is provided that includes a first drive circuit for receiving an input signal having a sharp waveform and generating an output signal that has a gentle waveform and is output from an output terminal of the output buffer circuit. A second drive circuit is connected to the output terminal and has a lower output impedance than the first drive circuit. A delay circuit is connected to the output terminal to delay the output signal and generating a delayed output signal. A first control circuit is connected between the delay circuit and the second drive circuit to receive the input signal and the delayed output signal and generate first control signal for driving the second drive circuit.

In a fourth aspect of the present invention, an output buffer circuit is provided that includes first and second output transistors connected in series between a first power supply and a second power supply. First and second control circuits are connected to the first and second output transistors to receive an input signal and respectively generate first and second control signals for controlling the first and second output transistors. The first and second output transistors generate an output signal at an output terminal of the output buffer circuit. A third control circuit is connected between the output terminal and the first and second control circuits to receive the input signal and the output signal and control a slew rate of the output signal by controlling slew rates of the first and second control signals in accordance with the input signal and the output signal. The third control circuit controls the first and second control circuits when the first and second output transistors are turned off to generate the first and second control signal in accordance with the input signal, and controls the first and second control circuits when the first and second output transistors are turned on such that the first and second control signals sharply rise or fall in response to a change in the input signal, gently rise or fall after a predetermined time elapses, and thereafter sharply rise or fall when the output signal reaches a predetermined level.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a schematic circuit diagram of an output buffer circuit according to a first embodiment of the present invention;

DETAILED DESCRIPTION OF THE PREFERRED EMBODIMENT

Figure 1:
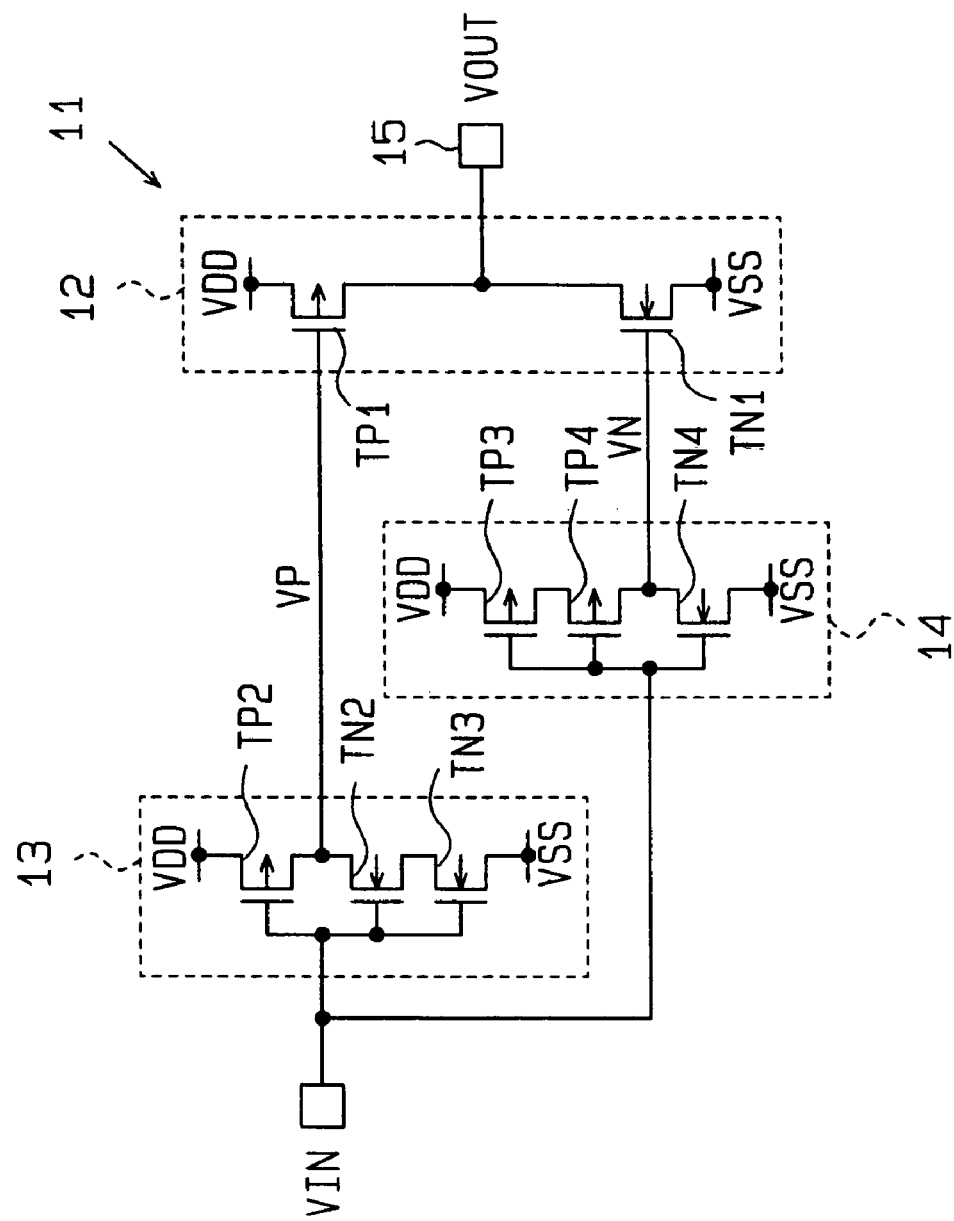
FIG. 1 is a schematic circuit diagram of a first prior art output buffer circuit.
Figure 2:
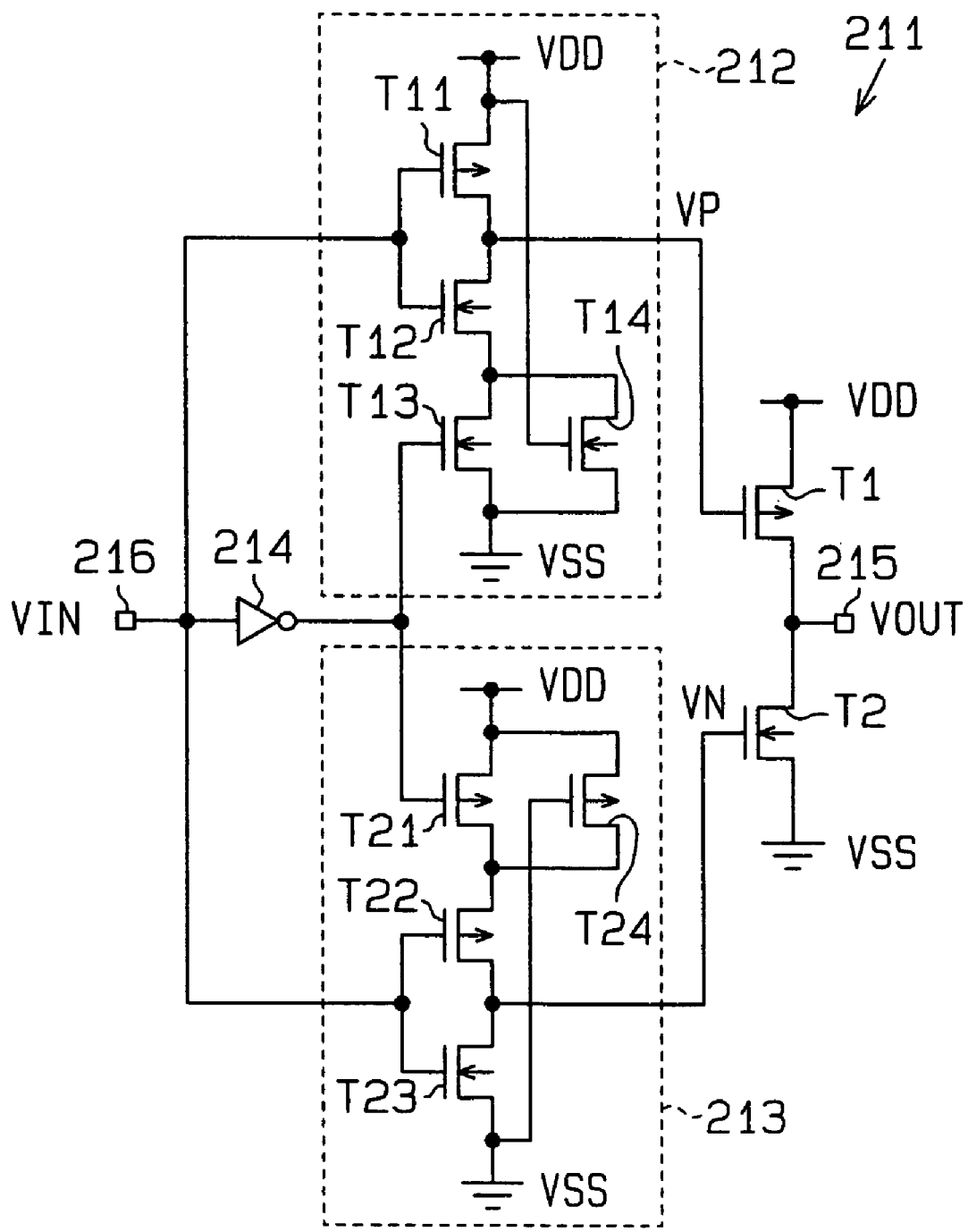
FIG. 2 is a schematic circuit diagram of a second prior art output buffer circuit.
Figure 3:
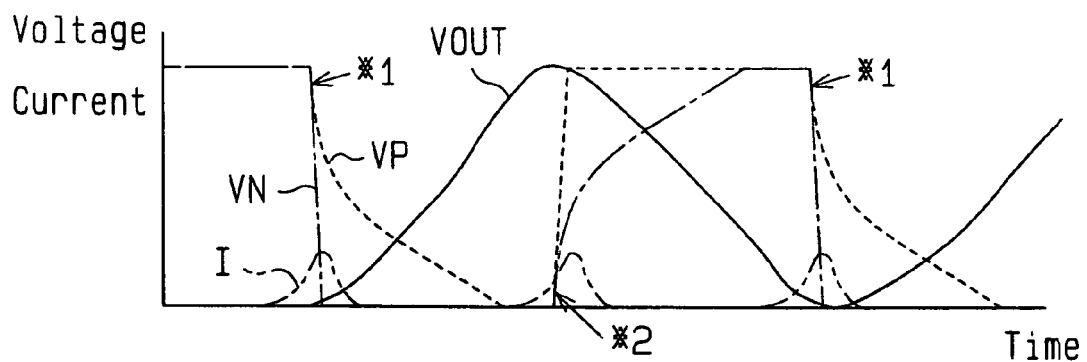
FIG. 3 is a waveform diagram for explaining the operation of the output buffer circuit in FIG. 2.
Figure 4A:
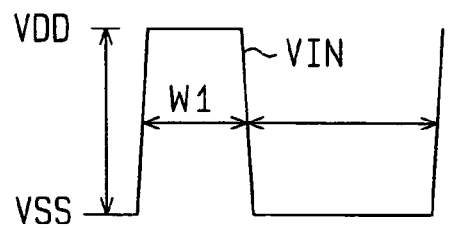
FIGS. 4(a)–4(c) are waveform diagrams for explaining the high-frequency operation of the output buffer circuit in FIG. 2.
Figure 4B:
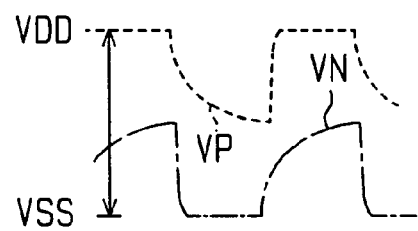
Figure 4C:
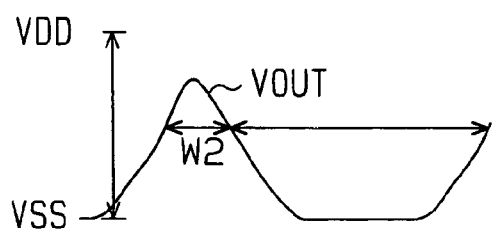

In the drawings, like numerals are used for like elements throughout.

FIG. 5 is a schematic circuit diagram of an output buffer circuit 21 according to the first embodiment of the present invention. The output buffer circuit 21 has first and second drive circuits 22 and 23, first and second control circuits 24 and 25, and a delay circuit 26. The output buffer circuit 21 receives an external input signal VIN from an input terminal 27 and generates an external output signal VOUT which has gentle rising and falling edges corresponding to a predetermined specification. The output buffer circuit 21 outputs the external output signal VOUT from an output terminal 28. The output buffer circuit 21 has a low impedance characteristic with respect to the output terminal 28.

The first drive circuit 22 generates the external output signal VOUT that has gentle rising and falling edges corresponding to a predetermined specification, and the second drive circuit 23 is provided for the low impedance characteristic.

The first drive circuit 22 includes a PMOS transistor (first output transistor) T1 and an NMOS transistor (second output transistor) T2, connected in series between a high-potential power supply VDD and a low-potential power supply VSS. The output transistors T1 and T2 have transistor sizes (gate widths) set such that the external output signal VOUT gently rises and falls in response to a sudden change in the input signal VIN. That is, the output transistors T1 and T2 have the transistor sizes so set as to have a high impedance characteristic. A first control signal Si from the first control circuit 24 is applied to the gate of the first output transistor T1, and a second control signal S2 from the first control circuit 24 is applied to the gate of the second output transistor T2.

The second drive circuit 23 includes a PMOS transistor (third output transistor) T3 and an NMOS transistor (fourth output transistor) T4, connected in series between the high-potential power supply VDD and the low-potential power supply VSS. The output transistors T3 and T4 have transistor sizes (gate widths) so set as to have a low impedance characteristic when the external output signal VOUT is in a static state. A third control signal S3 from the second control circuit 25 is applied to the gate of the third output transistor T3, and a fourth control signal S4 from the second control circuit 25 is applied to the gate of the fourth output transistor T4.

The first control circuit 24 includes two inverter circuits 31 and 32. The first inverter circuit 31 receives the external input signal VIN and generates the first control signal S1 which is the external input signal VIN inverted. The second inverter circuit 32 receives the external input signal VIN and generates the second control signal S2 which is the external input signal VIN inverted.

The second control circuit 25 includes a NAND gate 33 and a NOR gate 34. The NAND gate 33 receives the external input signal VIN and a delay signal SD from the delay circuit 26 and performs a NAND operation on the external input signal VIN and delay signal SD to generate the third control signal S3. The NOR gate 34 receives the external input signal VIN and the delay signal SD from the delay circuit 26 and performs a NOR operation on the external input signal VIN and delay signal SD to generate the fourth control signal S4.

The delay circuit 26 includes an even number of (four in this case) inverter circuits 35 to 38 connected in series. The first inverter circuit 35 is supplied with the external output signal VOUT and the last inverter circuit 38 outputs the delay signal SD. The external output signal VOUT is therefore delayed by a predetermined time in accordance with the number of the inverter circuits 35-38.

The number of the inverter circuits 35-38 is set such that the second drive circuit 23 operates with a predetermined delay time after the first drive circuit 22 operates in accordance with the characteristic of the first drive circuit 22. That is, because the output transistors T1 and T2 of the first drive circuit 22 have a high impedance characteristic, the external output signal VOUT that is generated by the first drive circuit 22 has gentle rising and falling edges. After the external output signal VOUT rises or falls sufficiently, the second drive circuit 23 is driven. The second drive circuit 23 has a low impedance characteristic. Therefore, the first drive circuit 22 causes the external output signal VOUT to gently rise and fall, and the second drive circuit 23 secures the low-output impedance characteristic.

Figure 6:
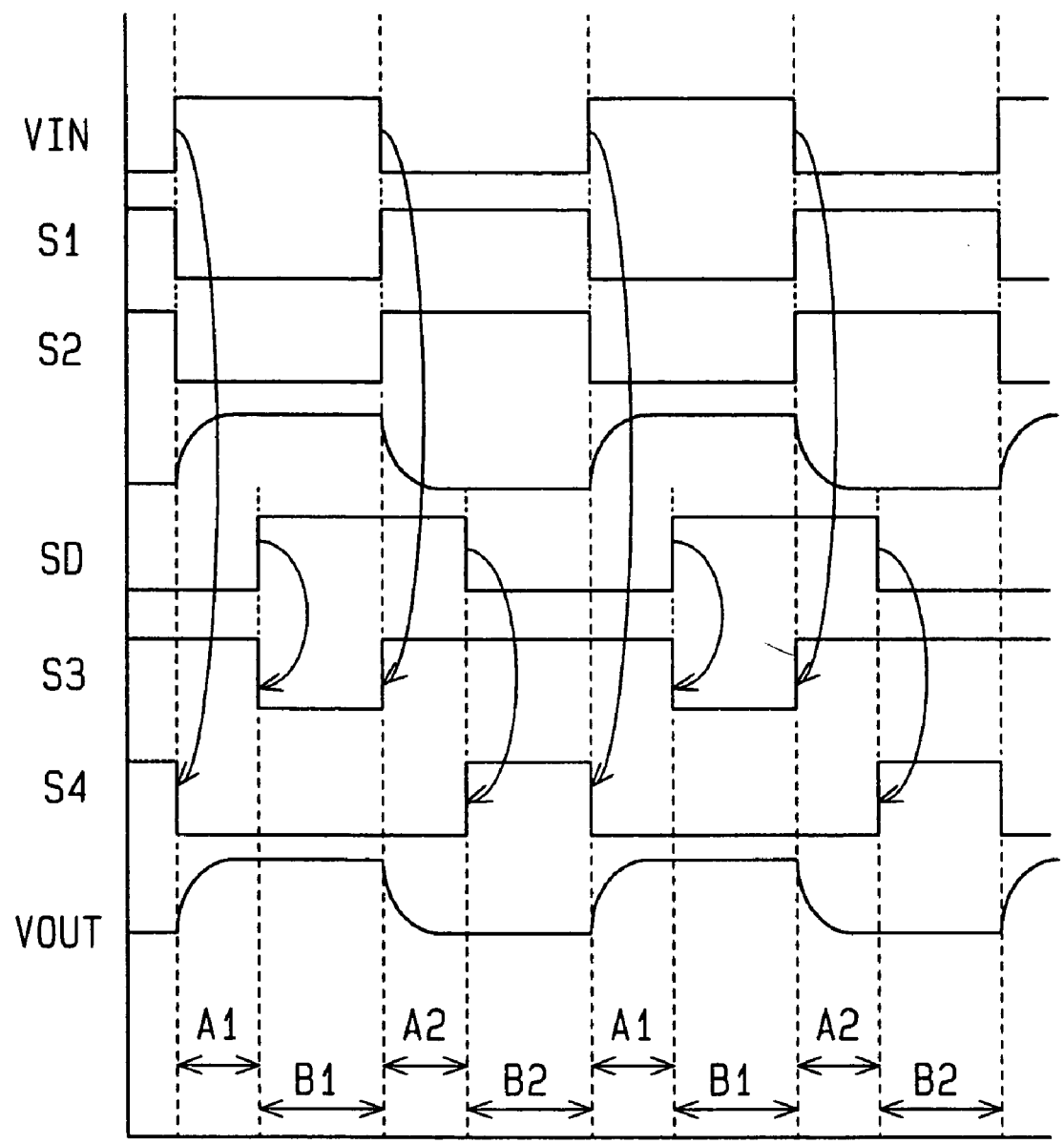
FIG. 6 is a waveform diagram for explaining the operation of the output buffer circuit in FIG. 5.

The operation of the output buffer circuit 21 will now be described referring to FIGS. 6 and 7.

First, a description will be given of the case where the external input signal VIN rises to the H level (the level of the high-potential power supply VDD) from the L level (the level of the low-potential power supply VSS). In this case, the period from the point of a change in the external output signal VOUT to the point of a change in delay signal SD is set as a first period (period A1 in FIG. 6), and a period after the delay signal SD changes is set as a second period (period B1 in FIG. 6).

[First Period]

In response to the rising of the input signal VIN, the first control circuit 24 causes the first and second control signals S1 and S2 to fall, thus turning on the first output transistor T1 and turning off the second output transistor T2.

The second control circuit 25 outputs the H-level third control signal S3 and causes the fourth control signal S4 to fall in response to the rising of the input signal VIN. This keeps the third output transistor T3 turned off and turns off the fourth output transistor T4. As a result, the first output transistor T1 having a high impedance characteristic causes the external output signal VOUT to slowly rise to the H level from the L level.

In the first period, the first and second output transistors T1 and T2 may be turned on simultaneously. As the output transistors T1 and T2 have a high impedance characteristic, however, the amounts of currents flowing in the output transistors T1 and T2 are smaller than the amounts of currents flowing in the conventional output transistors TP1 and TN1 that have a low impedance characteristic.

[Second Period]

In response to the rising of the delay signal SD, the second control circuit 25 causes the third control signal S3 to fall, thus turning on the third output transistor T3. The ON action of the third output transistor T3 causes the output buffer circuit 21 to have a low-output impedance characteristic. As apparent from the above, the fourth output transistor T4 is turned off first and then the third output transistor T3 is turned on after a predetermined time elapses. Therefore, the output transistors T3 and T4 are not turned on simultaneously, so that the through currents that flow in the output transistors T3 and T4 are almost zero.

A description will now be given of the case where the external input signal VIN falls to the L level from the H level. In this case, the period from the point of a change in the external output signal VOUT to the point of a change in delay signal SD is set as a third period (period A2 in FIG. 6), and a period after the delay signal SD changes is set as a fourth period (period B2 in FIG. 6).

[Third Period]

In response to the falling of the input signal VIN, the first control circuit 24 causes the first and second control signals S1 and S2 to rise, thus turning off the first output transistor T1 and turning on the second output transistor T2.

In response to the falling of the input signal VIN, the second control circuit 25 causes the third control signal S3 to rise and outputs the L-level fourth control signal S4. This turns off the third output transistor T3 and keeps the fourth output transistor T4 turned off. As a result, the second output transistor T2 having a high impedance characteristic causes the external output signal VOUT to slowly fall to the L level from the H level.

[Fourth Period]

In response to the falling of the delay signal SD, the second control circuit 25 causes the fourth control signal S4 to rise, thus turning on the fourth output transistor T4. The ON action of the fourth output transistor T4 causes the output buffer circuit 21 to have a low-output impedance characteristic. Apparently, the third output transistor T3 is turned off first and then the fourth output transistor T4 is turned on after a predetermined time elapses. Therefore, the output transistors T3 and T4 are not turned on simultaneously, so that the through currents that flow in output transistors T3 and T4 are almost zero (0).

Figure 7:
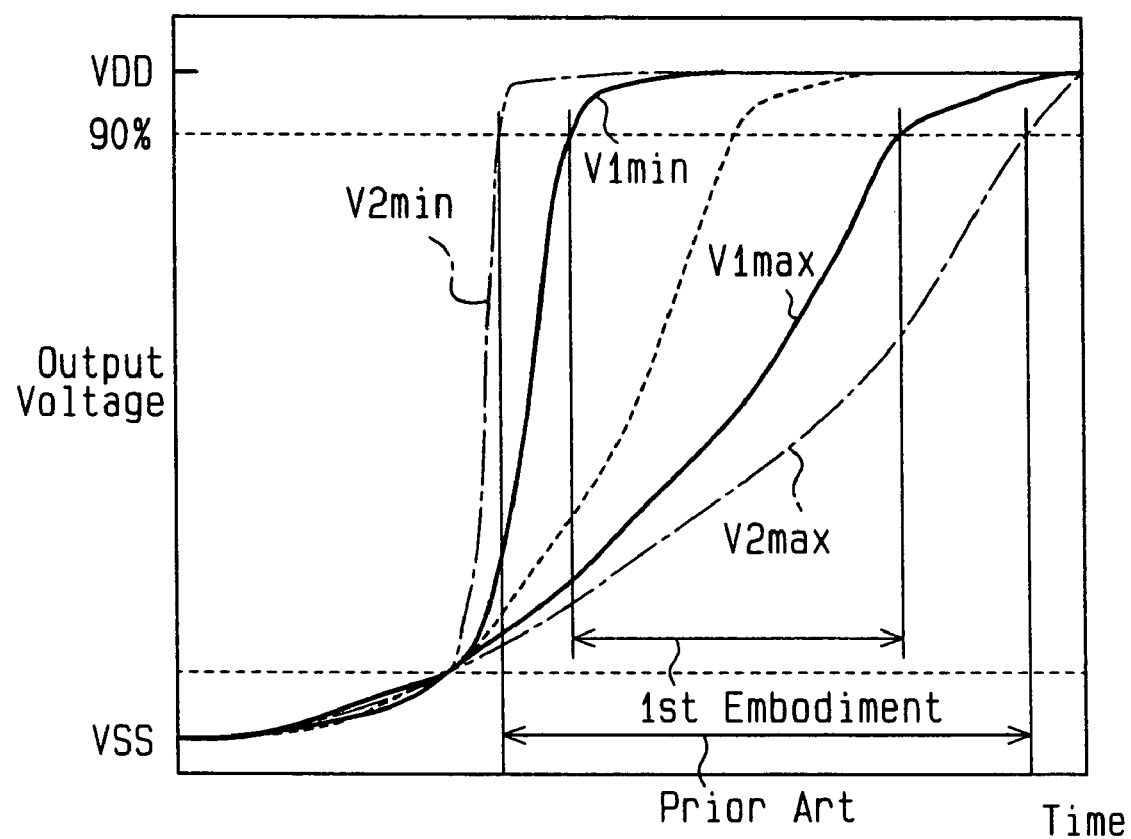
FIG. 7 is a waveform diagram for explaining the transition period of the output signal of the output buffer circuit in FIG. 5.

FIG. 7 shows the waveforms of the external output signals VOUT from the output buffer circuit 21 of the first embodiment and the conventional output buffer circuit 11. V1min indicates the waveform when the transition time of the external output signal VOUT of the output buffer circuit 21 is minimum, and V1max indicates the waveform when the transition time of the external output signal VOUT of the output buffer circuit 21 is maximum. V2min indicates the waveform when the transition time of the external output signal VOUT of the conventional output buffer circuit 11 is minimum, and V2max indicates the waveform when the transition time of the external output signal VOUT of the conventional output buffer circuit 11 is maximum. The transition time changes depending on variations of production processes and the like. According to the first embodiment, the first and second output transistors T1 and T2 have a high impedance characteristic and the first and second control signals S1 and S2 which show sharp rising and falling are applied to the gates of the first and second output transistors T1 and T2. As the first and second control signals S1 and S2 are unlikely to be affected by production variations, a variation in transition time is less than that in the prior art.

The output buffer circuit 21 of the first embodiment has the following advantages.

(1) The first drive circuit 22 generates the signal VOUT having a gentle waveform in response to the input signal VIN having a sharp waveform, and the second drive circuit 23 has a lower output impedance than the first drive circuit 22. The first and second control circuits 24 and 25 drive the second drive circuit 23 after the output signal VOUT is sufficiently changed by the first drive circuit 22 in response to the input signal VIN and the delay signal SD from the delay circuit 26. The control signals S1 and S2 that are applied to the gates of the respective output transistors T1 and T2 of the first drive circuit 22 are unlikely to be affected by production variations. Consequently, the first drive circuit 22 generates the output signal VOUT having a gentle waveform so that a variation in the transition time of the output signal VOUT becomes smaller due to the low impedance characteristic of the second drive circuit 23 in the static state of the output signal VOUT.

(2) The second control circuit 25 turns on the fourth output transistor T4 after the third output transistor T3 is turned off. The second control circuit 25 also turns on the third output transistor T3 after the fourth output transistor T4 is turned off. As a result, the third and fourth output transistors T3 and T4 are not turned on simultaneously, so that the through currents do not flow into the third and fourth output transistors T3 and T4. This prevents the consumed current from increasing.

Figure 8:
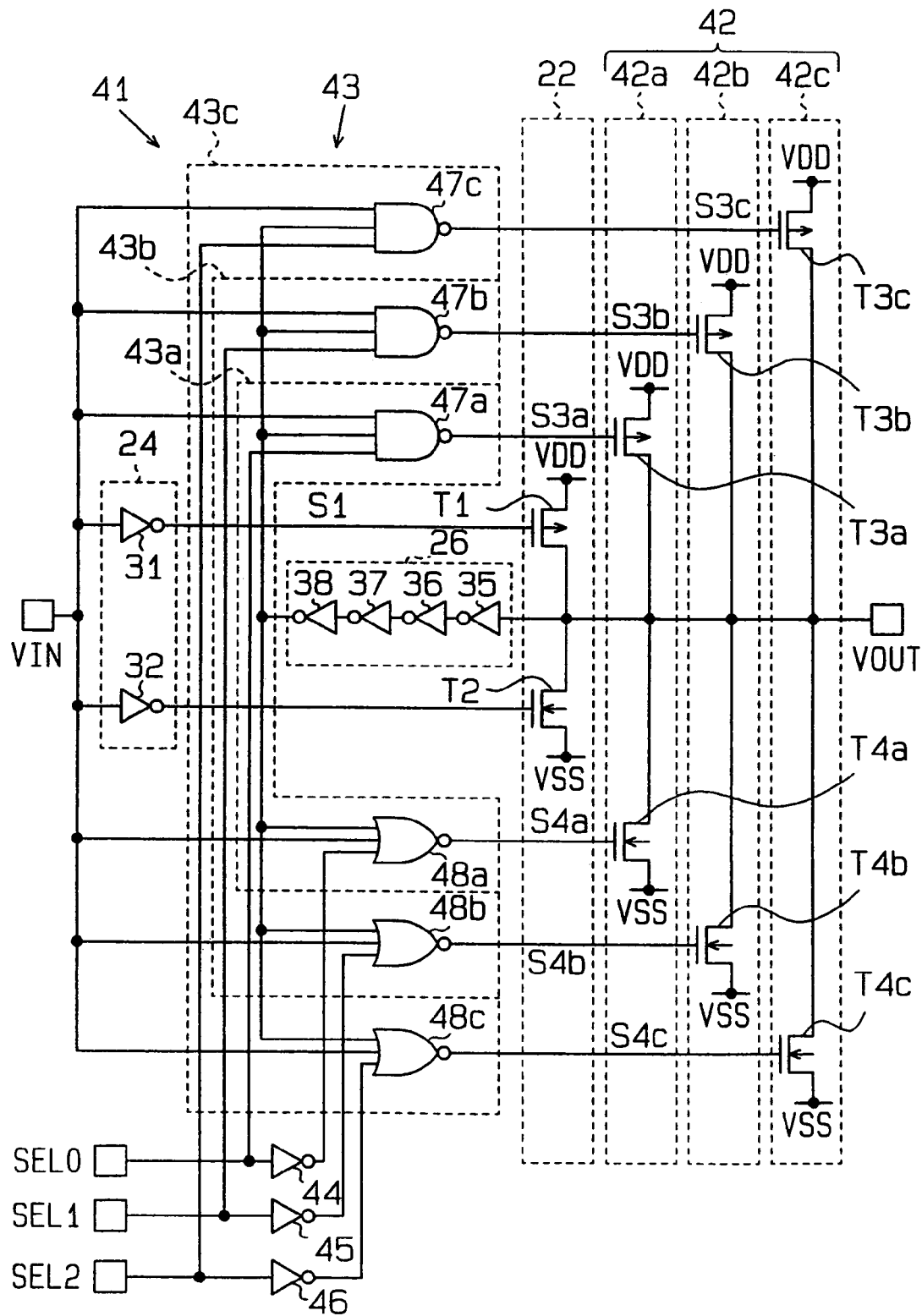
FIG. 8 is a schematic circuit diagram of an output buffer circuit according to a second embodiment of the present invention.

FIG. 8 is a schematic circuit diagram of an output buffer circuit 41 according to the second embodiment of the present invention. The output buffer circuit 41 alters the output impedance value. The output buffer circuit 41 includes first and second drive circuits 22 and 42, first and second control circuits 24 and 43, a delay circuit 26 and three inverter circuits 44, 45 and 46. The second drive circuit 42 includes a plurality of (three in this case) sub-drive circuits 42a, 42b and 42c, and the second control circuit 43 includes three associated sub-control circuits 43a, 43b and 43c.

The sub-drive circuits 42a, 42b and 42c respectively include PMOS transistors (output transistors) T3a to T3c and NMOS transistors (output transistors) T4a to T4c. At least one of the PMOS transistors T3a–T3c has a different impedance from those of the other.

The sub-control circuits 43a, 43b and 43c respectively include NAND gates 47a to 47c which generate control signals S3a to S3c for controlling the respective output transistors T3a–T3c, and NOR gates 48a to 48c which generate control signals S4a to S4c for controlling the respective output transistors T4a–T4c. Each of the NAND gates 47a–47c is a 3-input element which receives the external input signal VIN, the delay signal SD and a select signal SEL0, SEL1 or SEL2. Each of the NOR gates 48a–48c is a 3-input element which receives the external input signal VIN, the delay signal SD and the inverted select signal SEL0, SEL1 or SEL2, from an inverter circuit 44, 45 or 46.

When at least one of the select signals SEL1 to SEL2 goes high (H level), therefore, the control signals S3a–S3c and S4a–S4c are supplied to at least one of the sub-drive circuits 42a, 42b and 42c in response to the H-level select signal, thus enabling that sub-drive circuit. The output impedance of the output buffer circuit 41 is determined by at least one sub-drive circuit 42a–42c that has been enabled.

The second embodiment has the following advantage.

The output buffer circuit 41 has the second drive circuit 42 that includes three sub-drive circuits 42a–42c having different impedances. In accordance with the select signals SEL1 to SEL2, at least one of the sub-drive circuits 42a–42c is enabled to select the output impedance when the output signal VOUT is in a static state.

Figure 9:
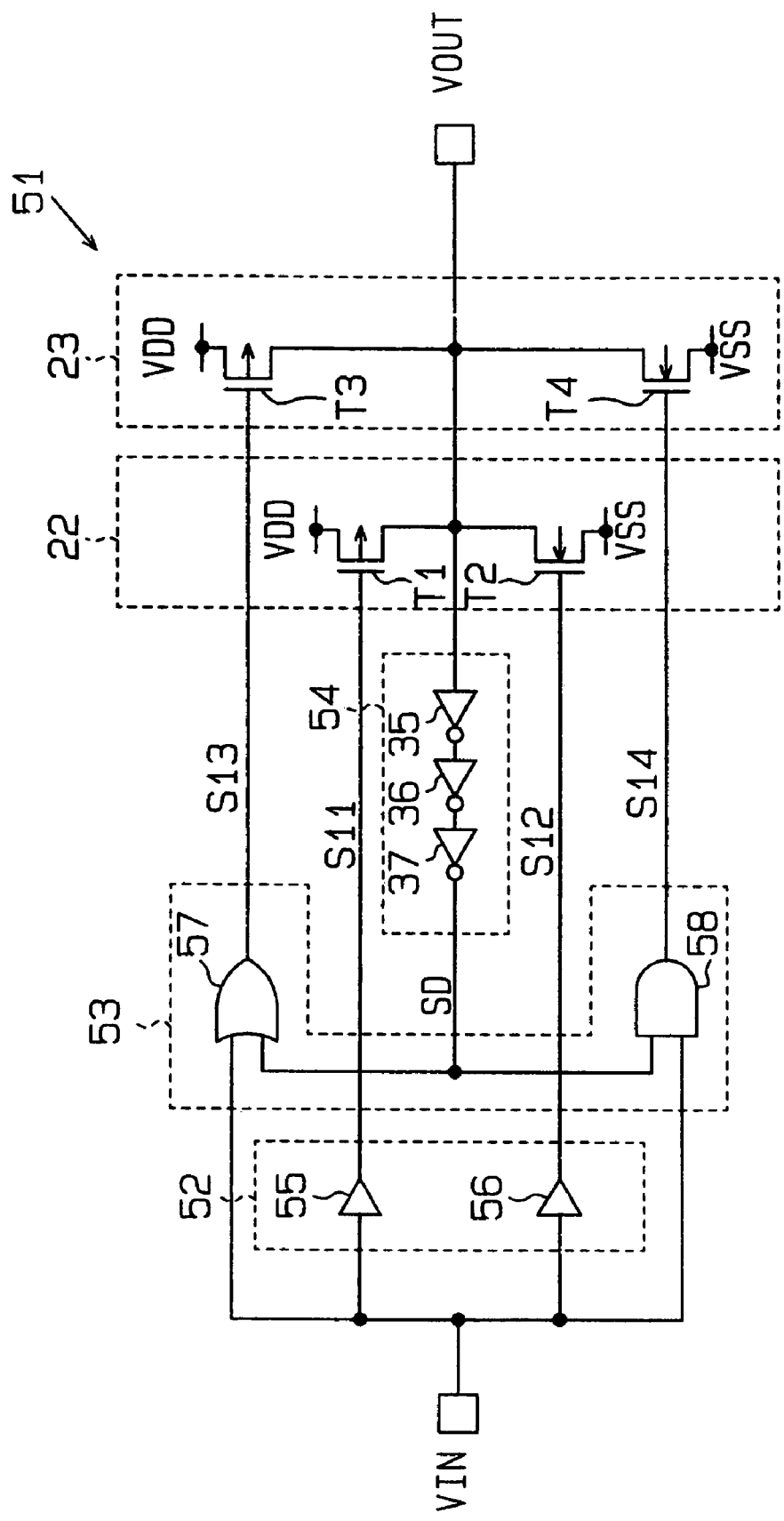
FIG. 9 is a schematic circuit diagram of an output buffer circuit according to a third embodiment of the present invention.

FIG. 9 is a schematic circuit diagram of an inversion output buffer circuit 51 according to the third embodiment of the present invention. The inversion output buffer circuit 51 generates the output signal VOUT whose phase is opposite to the phase of the input signal VIN. The output buffer circuit 51 has first and second drive circuits 22 and 23, first and second control circuits 52 and 53 and a delay circuit 54. The first control circuit 52 includes two buffer circuits 55 and 56. The buffer circuits 55 and 56 respectively apply first and second control signals S11 and S12 in phase with the input signal VIN to the gates of first and second output transistors T1 and T2. The second control circuit 53 has an OR gate 57, which generates a third control signal S13 that is supplied to the gate of a third output transistor T3, and an AND gate 58, which generates a fourth control signal S14 that is supplied to the gate of a fourth output transistor T4. The delay circuit 54, which includes an odd number of inverter circuits 35, 36 and 37, delays the external output signal VOUT and generates an inverted signal of the external output signal VOUT. The output buffer circuit 51 operates in a manner similar to that of the output buffer circuit 21 of the first embodiment.

The output buffer circuit 51 may be adapted to the second embodiment. As the first and second control signals S11 and S12 are in phase with the input signal VIN, the input signal VIN may be applied directly to the gates of the first and second output transistors T1 and T2. In this case, the first control circuit may be omitted.

The first to third embodiments may be embodied into an output buffer circuit which has only the output transistors T1 and T3 connected to the high-potential power supply VDD or an open-drain type output buffer circuit which has only the output transistors T2 and T4 connected to the low-potential power supply VSS.

Figure 10:
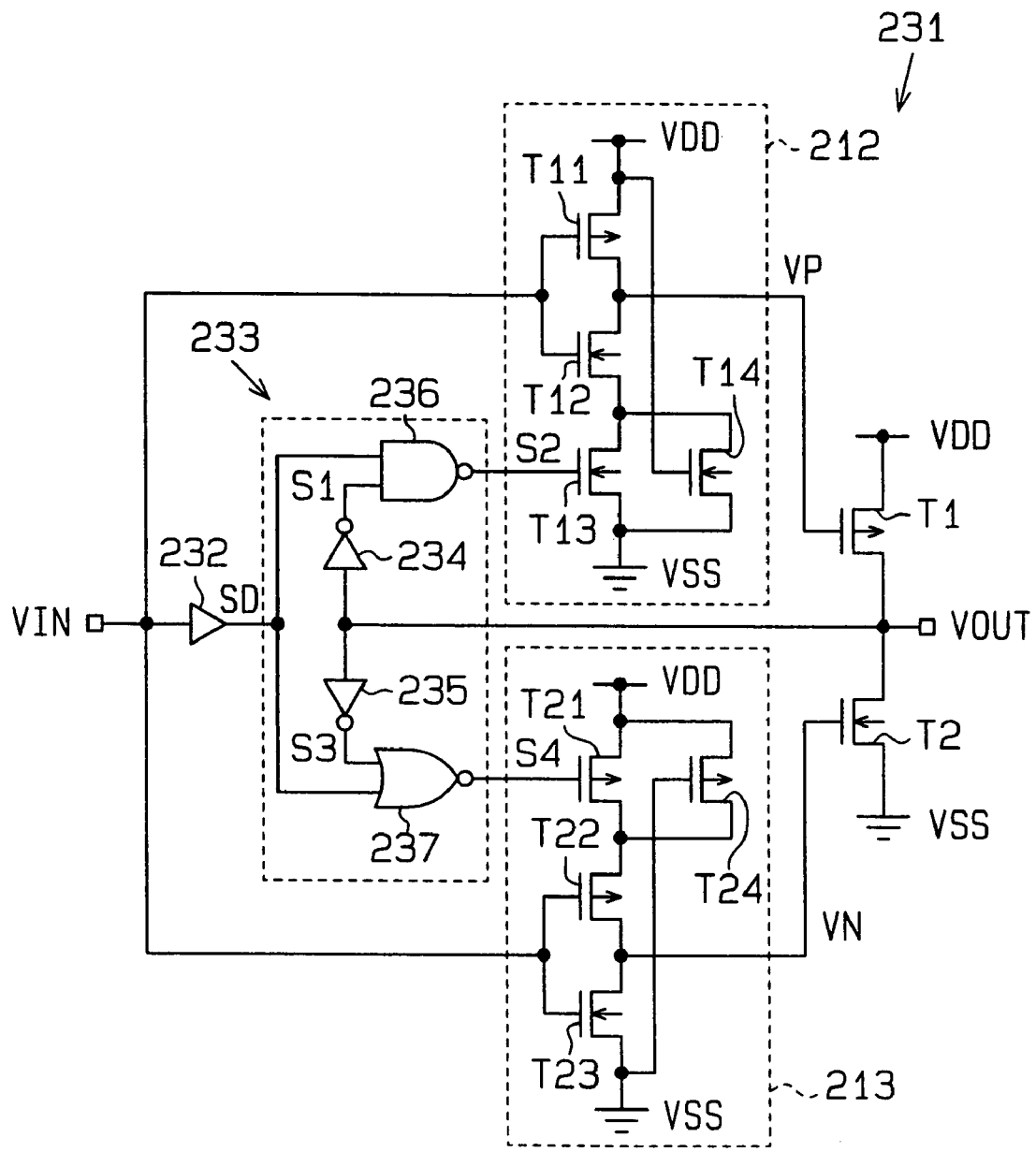
FIG. 10 is a schematic circuit diagram of an output buffer circuit according to a fourth embodiment of the present invention.

FIG. 10 is a schematic circuit diagram of a slew-rate control type output buffer circuit 231 according to the fourth embodiment of the present invention. The output buffer circuit 231 has first and second output driving transistors (hereinafter simply called "output transistors") T1 and T2, first and second slew-rate control circuits (hereinafter simply called "control circuits") 212 and 213 which perform the ON/OFF control of the respective output transistors T1 and T2 in response to the external input signal VIN, a delay circuit 232 and a signal generator 233.

The delay circuit 232, which is preferably a buffer circuit, receives the external input signal VIN and generates the delay signal SD which is the external input signal VIN delayed by substantially the same delay time as that of the conventional delay circuit 14.

The signal generator 233 includes first and second inverter circuits 234 and 235, a NAND gate 236 and a NOR gate 237.

The first inverter circuit 234 has a low threshold voltage Vt1 (about the voltage of VOL_max which is the L-level output interface standard for the output buffer circuit 231). Based on the threshold voltage Vt1, the first inverter circuit 234 supplies an inverted signal S1 of the external output signal VOUT to the NAND gate 236. The inverted signal S1 is kept at an L level while the voltage of the external output signal VOUT is higher than the threshold voltage Vt1.

The NAND gate 236 receives the inverted signal S1 and delay signal SD and performs a NAND operation on the inverted signal S1 and delay signal SD to generate a first switching control signal S2. The first switching control signal S2 is applied to the gate of an NMOS transistor T13. The first switching control signal S2 is kept at an L level during the period from the rising of the delay signal SD to the falling of the inverted signal S1. That is, the first switching control signal S2 is kept at the L level until the external output signal VOUT becomes higher than the threshold voltage Vt1 after a predetermined time has passed since the rising of the external input signal VIN. Therefore, the NMOS transistor T13 is set off during the period from the rising of the delay signal SD to the falling of the inverted signal S1. In other words, the signal generator 233 turns on the NMOS transistor T13 for a predetermined time since the rising of the external input signal VIN, temporarily turns off the NMOS transistor T13, and turns on the NMOS transistor T13 again in accordance with the level of the external output signal VOUT.

The ON/OFF of the NMOS transistor T13 determines the falling waveform of a control signal VP (i.e., the rising waveform of the external output signal VOUT). Specifically, the control signal VP falls sharply while the NMOS transistor T13 is on, and falls gently due to the ON resistance of an NMOS transistor T14 while the NMOS transistor T13 is off. Therefore, the external output signal VOUT rapidly reaches an operation start point as the NMOS transistor T13 is turned on at the rising of the external input signal VIN, and the external output signal VOUT gently rises as the NMOS transistor T13 is turned off. When the external output signal VOUT exceeds the threshold voltage Vt1, the NMOS transistor T13 is turned on again, causing the external output signal VOUT to sharply rise to the H level.

The second inverter circuit 235 has a high threshold voltage Vt2 (about the voltage of VOH_min which is the H-level output interface standard for the output buffer circuit 231). Based on the threshold voltage Vt2, the second inverter circuit 235 supplies an inverted signal S3 of the external output signal VOUT to the NOR gate 237. The inverted signal S3 is kept at an H level while the voltage of the external output signal VOUT is lower than the threshold voltage Vt2.

The NOR gate 237 receives the inverted signal S3 and the delay signal SD and performs a NOR operation on the inverted signal S3 and the delay signal SD to generate a second switching control signal S4. The second switching control signal S4 is supplied to the gate of a PMOS transistor T21. The second switching control signal S4 is kept at an H level during the period from the falling of the delay signal SD to the rising of the inverted signal S3. That is, the second switching control signal S4 is kept at the H level until the external output signal VOUT becomes lower than the threshold voltage Vt2 after a predetermined time has passed since the falling of the external input signal VIN. Therefore, the PMOS transistor T21 is off during the period from the falling of the delay signal SD to the rising of the inverted signal S3. In other words, the signal generator 233 turns on the PMOS transistor T21 for a predetermined time since the falling of the external input signal VIN, temporarily turns off the PMOS transistor T21, and turns on the PMOS transistor T21 again in accordance with the level of the external output signal VOUT.

The ON/OFF of the PMOS transistor T21 determines the rising waveform of a control signal VN (i.e., the falling waveform of the external output signal VOUT). Specifically, the control signal VN rises sharply while the PMOS transistor T21 is on, and rises gently due to the ON resistance of a PMOS transistor T24 while the PMOS transistor T21 is off. Therefore, the external output signal VOUT rapidly reaches the operation start point as the PMOS transistor T21 is turned on at the falling of the external input signal VIN, and the external output signal VOUT gently falls as the PMOS transistor T21 is turned off. When the external output signal VOUT exceeds the threshold voltage Vt2, the PMOS transistor T21 is turned on again, causing the external output signal VOUT to sharply fall to the L level.

Figure 11:
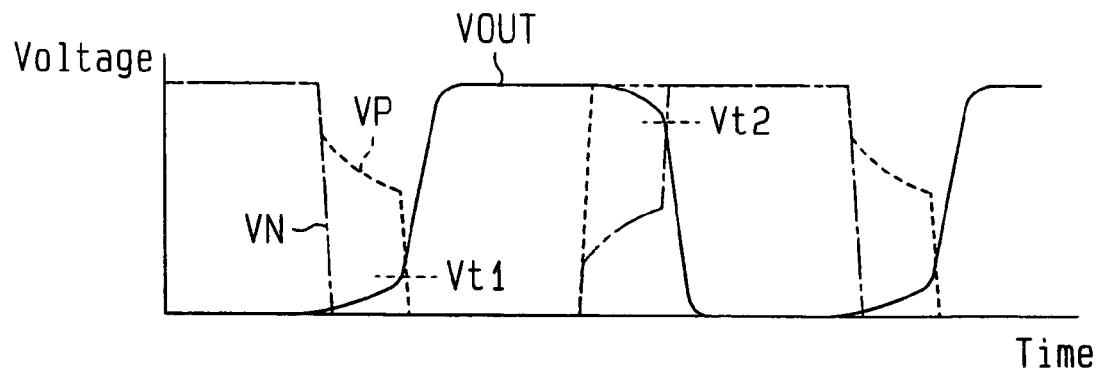
FIG. 11 is a waveform diagram for explaining the operation of the output buffer circuit in FIG. 10.

The operation of the output buffer circuit 231 will now be described referring to FIG. 11.

(1) When the external input signal VIN changes its level to the H level from the L level, a PMOS transistor T22 is turned off immediately and an NMOS transistor T23 is turned on. This causes the control signal VN to sharply fall to the L level from the H level, so that the second output transistor T2 is turned off immediately.

A PMOS transistor T11 is turned off immediately by the H-level external input signal VIN and an NMOS transistor T12 is turned on. The ON/OFF action of the NMOS transistor T13 is however controlled by the output signal S2 from the NAND gate 236. Immediately after the external input signal VIN changes to the H level, the NAND gate 236 receives the L-level delay signal SD from the delay circuit 232 (the L-level external input signal VIN before being changed) and the H-level inverted signal S1 from the first inverter circuit 234, and applies the H-level switching control signal S2 to the gate of the NMOS transistor T13, so that the NMOS transistor T13 is turned on. The ON action of the NMOS transistor T13 causes the control signal VP to sharply fall from the H level.

The delay time of the delay circuit 232 is set to the time for the control signal VP to fall down to the threshold voltage of the first output transistor T1 from the H level. When the control signal VP reaches the threshold voltage, therefore, the delay signal from the delay circuit 232 changes to the H level from the L level and the switching control signal S2 changes to the L level from the H level. This turns off the NMOS transistor T13. At this time, the NMOS transistor T14 having a large ON resistance causes the control signal VP to gently fall and causes the external output signal VOUT to gently rise.

When the external output signal VOUT rises to the threshold voltage Vt1 of the first inverter circuit 234 thereafter, the inverted signal from the inverter circuit 234 changes to the L level from the H level and the switching control signal S2 changes to the H level from the L level. As a result, the NMOS transistor T13 is turned on. The turned-on NMOS transistor T13 causes the control signal VP to sharply fall to the L level. Accordingly, the external output signal VOUT sharply rises to the H level.

(2) When the external input signal VIN changes its level to the L level from the H level, the NMOS transistor T12 is turned off immediately and the PMOS transistor T11 is turned on. This causes the control signal VP to sharply rise to the H level from the L level, so that the first output transistor T1 is turned off immediately.

The NMOS transistor T23 is turned off immediately in response to the L-level external input signal VIN and the PMOS transistor T22 is turned on. However, the ON/OFF action of the PMOS transistor T21 is controlled by the switching control signal S4 from the NOR gate 237. Immediately after the external input signal VIN changes to the L level, the NOR gate 237 receives the H-level delay signal SD from the delay circuit 232 (the H-level external input signal VIN before being changed) and the L-level inverted signal S3 from the second inverter circuit 235, and applies the L-level switching control signal S4 to the gate of the PMOS transistor T21, so that the PMOS transistor T21 is turned on. The ON action of the PMOS transistor T21 causes the control signal VN to sharply rise from the L level.

The delay time of the delay circuit 232 is set to the time for the control signal VN to rise to the threshold voltage of the second output transistor T2 from the L level. When the control signal VN reaches the threshold voltage, therefore, the delay signal from the delay circuit 232 changes to the L level from the H level and the switching control signal S4 changes to the H level from the L level. This turns off the PMOS transistor T21. At this time, the PMOS transistor T24 having a large ON resistance causes the control signal VN to gently rise and causes the external output signal VOUT to gently fall.

When the external output signal VOUT falls to the threshold voltage Vt2 of the inverter circuit 235 thereafter, the inverted signal from the inverter circuit 235 changes to the H level from the L level and the switching control signal S4 changes to the L level from the H level. This turns on the PMOS transistor T21. The turned-on PMOS transistor T21 causes the control signal VN to sharply rise to the H level. Accordingly, the external output signal VOUT sharply falls to the L level.

The first and second control circuits 212 and 213 and the signal generator 233 cause the control signals VP and VN to sharply rise or fall in accordance with the level of the external output signal VOUT. This brings about only the influence such that the PTV variation changes the rising and falling positions of the control signals VP and VN and the external output signal VOUT with respect to the time. In other words, the pulse width is not affected by production variations (PTV).

As the control signals VP and VN and the external output signal VOUT make full swing, the output buffer circuit 231 can cope with fast (high-frequency) data transfer.

Figure 12A:
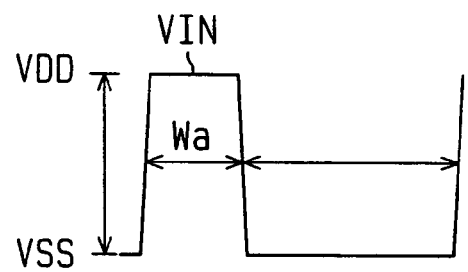
FIGS. 12(a)–12(c) are waveform diagrams for explaining the high-frequency operation of the output buffer circuit in FIG. 10.
Figure 12B:
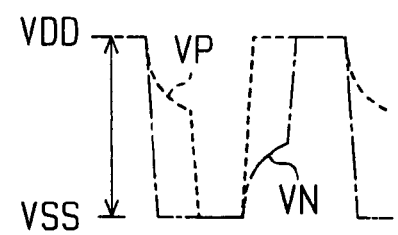
Figure 12C:
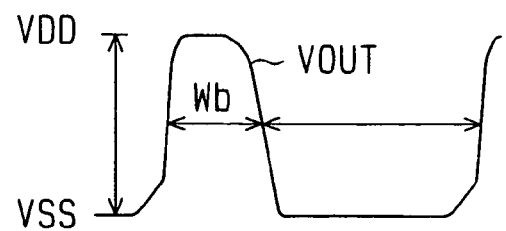

When the external input signal VIN which has a short H-level pulse width Wa as shown in FIG. 12(a) is supplied, for example, the control signals VP and VN surely reach the H level or the L level until the external input signal VIN changes, so that the control signals VP and VN swing fully. As a result, the external output signal VOUT swings fully to generate the external output signal VOUT whose pulse width Wb is substantially equal to the H-level pulse width Wa of the external input signal VIN.

The output buffer circuit 231 according to the fourth embodiment has the following advantages.

(1) When the ON/OFF states of the first and second output transistors T1 and T2 are, switched in accordance with the input signal VIN, the output transistor T1 (or T2) is turned off immediately by the control signal VP (or VN) and the output transistor T2 (or T1) is turned on by the control signal VN (or VP) which changes gently. The first and second output transistors T1 and T2 therefore are not turned on simultaneously, so that the through currents which flow in the output transistors T1 and T2 are smaller. This reduces the consumed current.

(2) During the delay time of the delay circuit 232, the transistors T13 and T21 of the first and second control circuits 212 and 213 are turned on, causing the control signals VP and VN to rise sharply. This sharp rising quickens the rising and falling responses of the external output signal VOUT, thus shortening the propagation delay time of the output buffer circuit 231.

(3) Based on the level of the external output signal VOUT, the control signals VP and VN sharply rise or fall while the control signals VP and VN are gently rising or falling. Consequently, the control signals VP and VN change to the H level and L level in a short period of time and swing fully, and the external output signal VOUT swings fully too. Therefore, the output buffer circuit 231 can cope with fast (high-frequency) data transfer and can thus have a wide frequency band.

(4) As the control signals VP and VN and the external output signal VOUT swing fully, a change in pulse width caused by the PTV variation is suppressed, thus making it possible to generate the external output signal VOUT whose pulse width is substantially equal to the pulse width of the input signal VIN.

(5) The external output signal VOUT is fed back to the NAND gate 236 and the NOR gate 237 using the first inverter circuit 234 having a low threshold voltage and the second inverter circuit 235 having a high threshold voltage. Therefore, an inflection point appears in the waveform of the external output signal VOUT near the H level or the L level thereof. This reduces the possible noise-oriented interference on the interface with the receiving side. In other words, an inflection point does not appear in the vicinity of the intermediate potential of the external output signal VOUT.

Figure 13:
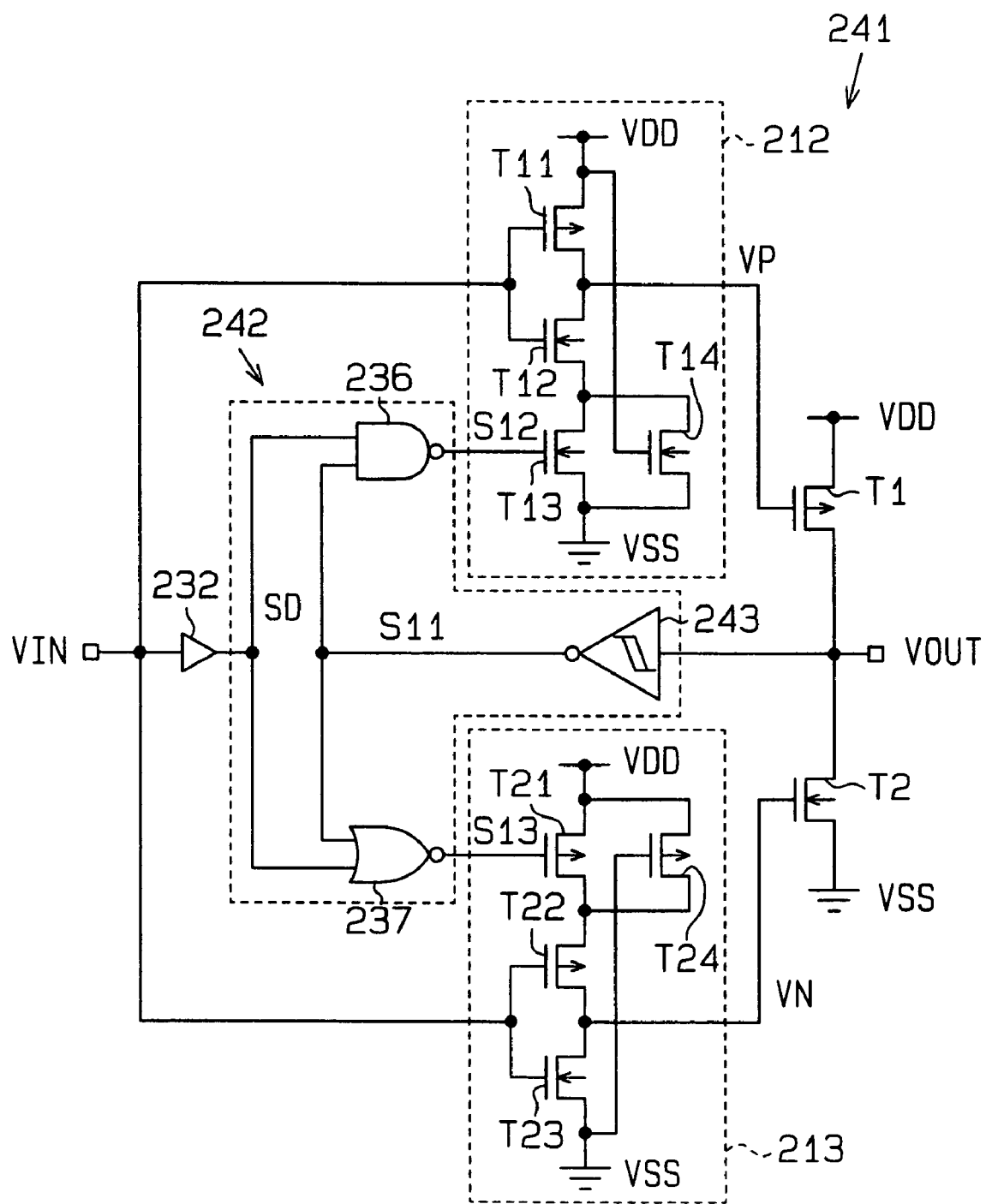
FIG. 13 is a schematic circuit diagram of an output buffer circuit according to a fifth embodiment of the present invention.
Figure 14:
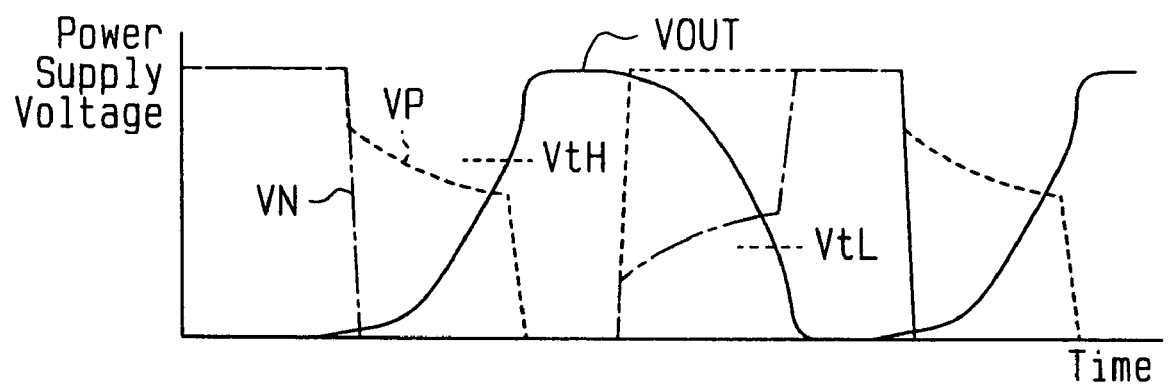
FIG. 14 is a waveform diagram for explaining the operation of the output buffer circuit in FIG. 13.

FIG. 13 is a circuit diagram of an output buffer circuit 241 according to the fifth embodiment of the present invention.

The output buffer circuit 241 has first and second output transistors T1 and T2, first and second control circuits 212 and 213 which perform the ON/OFF control of the respective output transistors T1 and T2 in response to the external input signal VIN, a delay circuit 232 and a signal generator 242.

The signal generator 242 includes a NAND gate 236, a NOR gate 237 and a Schmitt inverter circuit 243. The inverter circuit 243, which has a hysteresis characteristic, receives the external output signal VOUT and supplies the NAND gate 236 and the NOR gate 237 with an inverted signal S11 of the external output signal VOUT.

The inverter circuit 243 has a relatively wide hysteresis width, and its L-side threshold voltage VtL is set to about VOL_max which is the L-level output interface standard of the output buffer circuit 241 while its H-side threshold voltage VtH is set to about VOH_min which is the H-level output interface standard.

(1) When the external input signal VIN changes its level to the H level from the L level, the control signal VP is caused to sharply fall from the H level to the threshold voltage of the first output transistor T1 by the turned-on NMOS transistor T13. When the NMOS transistor T13 is turned off, the control signal VP gently falls due to the ON resistance of the NMOS transistor T14. Accordingly, the external output signal VOUT rises gently.

The H-side threshold voltage VtH of the Schmitt inverter circuit 243 is set to about VOH_min which is the H-level output interface standard of the buffer. When the external output signal VOUT reaches the threshold voltage VtH, therefore, the inverted signal S11 from the Schmitt inverter circuit 243 changes to the L level from the H level, causing the output signal S12 of the NAND gate 236 to change to the H level from the L level. As a result, the NMOS transistor T13 is turned on. The turned-on NMOS transistor T13 causes the control signal VP to sharply fall to the L level.

(2) When the external input signal VIN changes its level to the L level from the H level, the control signal VN sharply rises to the threshold voltage of the second output transistor T2 due to the turned-on PMOS transistor T21. When the PMOS transistor T21 is turned off, the control signal VN gently rises due to the ON resistance of the PMOS transistor T24. Accordingly, the external output signal VOUT falls gently.

The L-side threshold voltage VtL of the Schmitt inverter circuit 243 is set to about VOL_max which is the L-level output interface standard of the buffer. When the external output signal VOUT reaches the threshold voltage VtL, therefore, the inverted signal S1 from the Schmitt inverter circuit 243 changes to the H level from the L level, causing the output signal S13 of the NOR gate 237 to change to the H level from the L level. As a result, the PMOS transistor T21 is turned on. The turned-on PMOS transistor T21 causes the control signal VN to sharply rise to the H level.

The output buffer circuit 241 of the fifth embodiment has the following advantages. The individual transitional points of a sharp change to a slow change to a sharp change of the control signals VP and VN can be adjusted by adjusting the hysteresis width and threshold voltage of the Schmitt inverter circuit 243 and the delay time of the delay circuit 232. It is therefore possible to make the output buffer circuit 241 conform to the external interface specifications which define the maximum and minimum standards of the slow and gentle slew rate, so that the external output signal VOUT whose slew rate satisfies the standards can be generated.

The output buffer circuits according to the fourth and fifth embodiments may be embodied in an inversion type output buffer circuit. The inversion type output buffer circuit has an inverter circuit connected to, for example, its input terminal. Alternatively, the inversion type output buffer circuit may be constructed by modifying the first and second control circuits 212 and 213, the delay circuit 232 and the signal generator 233.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. An output buffer circuit comprising:
   first and second output transistors connected in series between a first power supply and a second power supply;
   first and second control circuits, connected to the first and second output transistors, for receiving an input signal and respectively generating first and second control signals for controlling the first and second output transistors, wherein the first and second output transistors generate an output signal at an output terminal of the output buffer circuit; and
   a third control circuit, connected between the output terminal and the first and second control circuits, for receiving the input signal and the output signal and controlling a slew rate of the output signal by controlling slew rates of the first and second control signals in accordance with the input signal and the output signal, wherein the third control circuit controls the first and second control circuits when the first and second output transistors are turned off to generate the first and second control signal in accordance with the input signal, and controls the first and second control circuits when the first and second output transistors are turned on such that the first and second control signals sharply rise or fall in response to a change in the input signal, gently rise or fall after a predetermined time elapses, and thereafter sharply rise or fall when the output signal reaches a predetermined level.

2. The output buffer circuit according to claim 1, wherein the first and second control circuits respectively include first and second switching elements and first and second resistor elements respectively connected in parallel to the first and second switching elements; and
   the output buffer circuit further comprises a delay circuit, connected to the third control circuit, for generating a delay signal by delaying the input signal,
   wherein when the first and second output transistors are turned on, the third control circuit controls the first and second control circuits in accordance with the delay signal and the output signal such that the first and second control signals are generated by turning on and off the first and second switching elements.

3. The output buffer circuit according to claim 2, wherein the third control circuit includes:
   a first inverter circuit, connected to the output terminal and having a relatively low threshold voltage, for receiving the output signal and generating a first inverted signal;
   a second inverter circuit, connected to the output terminal and having a relatively high threshold voltage, for receiving the output signal and generating a second inverted signal;

a NAND gate, connected to the delay circuit and the first inverter circuit, for receiving the delay signal and the first inverted signal and generating a first switching control signal for controlling the first switching element; and a NOR gate, connected to the delay circuit and the second inverter circuit, for receiving the delay signal and the second inverted signal and generating a second switching control signal for controlling the second switching element.

4. The output buffer circuit according to claim 2, wherein the third control circuit includes:

a Schmitt inverter circuit, connected to the output terminal and having a hysteresis characteristic, for receiving the output signal and generating an inverted output signal;

a NAND gate, connected to the delay circuit and the Schmitt inverter circuit, for receiving the delay signal and the inverted output signal and generating a first switching control signal for controlling the first switching element; and a NOR gate, connected to the delay circuit and the Schmitt inverter circuit, for receiving the delay signal and the inverted output signal and generating a second switching control signal for controlling the second switching element.

5. An output buffer circuit comprising:

first and second output transistors connected in series between a first power supply and a second power supply;

first and second control circuits, respectively connected to the first and second output transistors, for receiving an input signal and respectively generating first and second control signals for controlling the first and second output transistors, wherein the first and second output transistors generate an output signal that is output from an output terminal of the output buffer circuit in response to the first and second control signals, the first and second control circuits respectively including first and second switching elements and first and second resistor elements respectively connected in parallel to the first and second switching elements; and a third control circuit, connected between the output terminal and the first and second control circuits, for receiving the input signal and the output signal and controlling a slew rate of the output signal by controlling slew rates of the first and second control signals in accordance with the input signal and the output signal, the third control circuit including, a first inverter circuit, connected to the output terminal and having a relatively low threshold voltage, for receiving the output signal and generating a first inverted signal, a second inverter circuit, connected to the output terminal and having a relatively high threshold voltage, for receiving the output signal and generating a second inverted signal, a NAND gate, connected to the first inverter circuit, for receiving the input signal and the first inverted signal and generating a first switching control signal for controlling the first switching element, and a NOR gate, connected to the second inverter circuit, for receiving the input signal and the second inverted signal and generating a second switching control signal for controlling the second switching element.

6. An output buffer circuit comprising:

first and second output transistors connected in series between a first power supply and a second power supply;

first and second control circuits, respectively connected to the first and second output transistors, for receiving an input signal and respectively generating first and second control signals for controlling the first and second output transistors, wherein the first and second output transistors generate an output signal that is output from an output terminal of the output buffer circuit in response to the first and second control signals, the first and second control circuits respectively including first and second switching elements and first and second resistor elements respectively connected in parallel to the first and second switching elements; and a third control circuit, connected between the output terminal and the first and second control circuits, for receiving the input signal and the output signal and controlling a slew rate of the output signal by controlling slew rates of the first and second control signals in accordance with the input signal and the output signal, the third control circuit including, a Schmitt inverter circuit, connected to the output terminal and having a hysteresis characteristic, for receiving the output signal and generating an inverted output signal, a NAND gate, connected to the Schmitt inverter circuit, for receiving the input signal and the inverted output signal and generating a first switching control signal for controlling the first switching element, and a NOR gate, connected to the Schmitt inverter circuit, for receiving the input signal and the inverted output signal and generating a second switching control signal for controlling the second switching element.

7. A semiconductor device comprising:

an output buffer circuit including, first and second output transistors connected in series between a first power supply and a second power supply, first and second control circuits, connected to the first and second output transistors, for receiving an input signal and respectively generating first and second control signals for controlling the first and second output transistors, wherein the first and second output transistors generate an output signal output from an output terminal of the output buffer circuit in response to the first and second control signals, and a third control circuit, respectively connected between the output terminal and the first and second control circuits, for receiving the input signal and the output signal and controlling a slew rate of the output signal by controlling slew rates of the first and second control signals in accordance with the input signal and the output signal, wherein the third control circuit controls the first and second control circuits when the first and second output transistors are turned off to generate the first and second control signal in accordance with the input signal, and controls the first and second control circuits when the first and second output transistors are turned on such that the first and second control signals sharply rise or fall in response to a change in the input signal, gently rise or fall after a predetermined time elapses, and thereafter sharply rise or fall when the output signal reaches a predetermined level.

* * * * *